(12) United States Patent
Chang et al.

(10) Patent No.: US 12,363,855 B2
(45) Date of Patent: Jul. 15, 2025

(54) ELECTRONIC SYSTEM WITH HEAT DISSIPATION AND NOISE REDUCTION FUNCTION AND RELATED ACOUSTIC FILTER

(71) Applicant: Acer Incorporated, New Taipei (TW)

(72) Inventors: Jia-Ren Chang, New Taipei (TW); Po-Jen Tu, New Taipei (TW); Ruey-Ching Shyu, New Taipei (TW); Kai-Meng Tzeng, New Taipei (TW); Feng-Ming Liu, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 394 days.

(21) Appl. No.: 17/898,972

(22) Filed: Aug. 30, 2022

(65) Prior Publication Data

US 2023/0254992 A1    Aug. 10, 2023

(30) Foreign Application Priority Data

Feb. 8, 2022    (TW) .................................. 111104502

(51) Int. Cl.
*G06F 1/16*    (2006.01)
*H05K 5/00*    (2025.01)
(Continued)

(52) U.S. Cl.
CPC ................ *H05K 7/20181* (2013.01)

(58) Field of Classification Search
CPC ............ H05K 7/20181; H05K 7/2019; H05K 7/20172; H05K 7/20145; H05K 7/20136
See application file for complete search history.

(56) References Cited

U.S. PATENT DOCUMENTS 5,592,363 A * 1/1997 Atarashi ............... H01L 23/467
361/689
6,459,578 B1 * 10/2002 Wagner .............. H05K 7/20145
165/104.34
(Continued)

FOREIGN PATENT DOCUMENTS

CN    113646541 A    11/2021
JP    2001222065 A    8/2010

OTHER PUBLICATIONS

TW Search Report, Oct. 14, 2022, 1 page.
TW Office Action, Oct. 19, 2022, 8 pages.

*Primary Examiner* — Anthony M Haughton
(74) *Attorney, Agent, or Firm* — Edell, Shapiro & Finnan, LLC

(57) ABSTRACT

An electronic system includes a system air outlet, a heat sink, a fan and an acoustic filter. The acoustic filter is disposed between the system air vent and the heat sink and includes a front duct, a back duct and a single expansion chamber. A sound-receiving opening of the front duct is in airtight connection with the heat sink, and the sound-emitting opening of the back duct is in airtight connection with the system air vent. The single expansion chamber is disposed between the front duct and the back duct, and is located between the sound-emitting opening of the front duct and the sound-receiving opening of the back duct. The cross-sectional area of the single expansion chamber is larger than the cross-sectional area of an air outlet of the fan for generating reflective acoustic waves having a cut-off frequency so as to cancel noise generated by the fan.

19 Claims, 12 Drawing Sheets

(51) Int. Cl.
  *H05K 7/00*    (2006.01)
  *H05K 7/20*    (2006.01)

(56) References Cited

U.S. PATENT DOCUMENTS

| | | | |
|---|---|---|---|
| 8,862,017 B2* | 10/2014 | Rodriguez | G03G 21/20 |
| | | | 399/92 |
| 10,133,321 B1* | 11/2018 | Bhopte | H05K 7/20145 |
| 11,262,820 B1* | 3/2022 | North | G06F 1/3296 |
| 11,262,821 B1* | 3/2022 | North | G06F 1/3296 |
| 2008/0106864 A1* | 5/2008 | Merino | G06F 1/20 |
| | | | 361/688 |
| 2011/0121654 A1 | 5/2011 | Recker et al. | |
| 2017/0221526 A1* | 8/2017 | Albrecht | G11B 33/144 |
| 2021/0173456 A1* | 6/2021 | Kulkarni | H05K 7/20163 |
| 2024/0164050 A1* | 5/2024 | Killen, Jr. | H05K 7/20172 |

* cited by examiner

ELECTRONIC SYSTEM WITH HEAT DISSIPATION AND NOISE REDUCTION FUNCTION AND RELATED ACOUSTIC FILTER

This application claims the benefit of Taiwan Application Serial No. 111104502, filed Feb. 8, 2022, the subject matter of which is incorporated herein by reference in its entirety.

TECHNICAL FIELD

The present invention provides an electronic system and a related acoustic filter, particularly an electronic system and a related acoustic filter with heat dissipation and noise reduction capabilities.

BACKGROUND

Computer systems have become an indispensable tool for most people. In order to avoid power reduction of, or damage to, components due to overheating, computer systems generally use a fan to provide heat dissipation, so as to discharge heat generated inside the device and/or to draw in cool air from outside of the device.

The speed and static pressure of the fan determine the air flow of the fan. Fan noise is proportional to the speed of the fan. That is, the faster the speed of the fan, the greater the heat dissipation. However, this greater heat dissipation comes at a cost of greater fan noise.

As the functionality of a central processing unit (CPU) increases, so does the heat generated inside the CPU. In addition, the trend of computer system miniaturization continues to reduce heat flow efficiency. Thus, an effective strategy for balancing heat dissipation and noise reduction is of interest to those skilled in the art.

SUMMARY

In accordance with an embodiment, an electronic system includes a system air outlet, a heat sink, a fan disposed adjacent the heat sink, and an acoustic filter disposed between the system air outlet and the heat sink, wherein the acoustic filter comprises an expansion chamber having a cross sectional area greater than a cross sectional area of an outlet of the fan.

In another embodiment, an electronic system includes a system air outlet, a heat sink, a fan disposed adjacent a first side of the heat sink, and an acoustic filter disposed between the system air outlet and a second side of the heat sink, wherein the acoustic filter comprises a front duct, a back duct, and an expansion chamber disposed between the front duct and the back duct, wherein the expansion chamber has a width that is greater than a width of the front duct.

BRIEF DESCRIPTION OF THE DRAWINGS

Embodiments are described herein in conjunction with the accompanying drawings, in which.

DESCRIPTION OF EXAMPLE EMBODIMENTS

Figure 1:
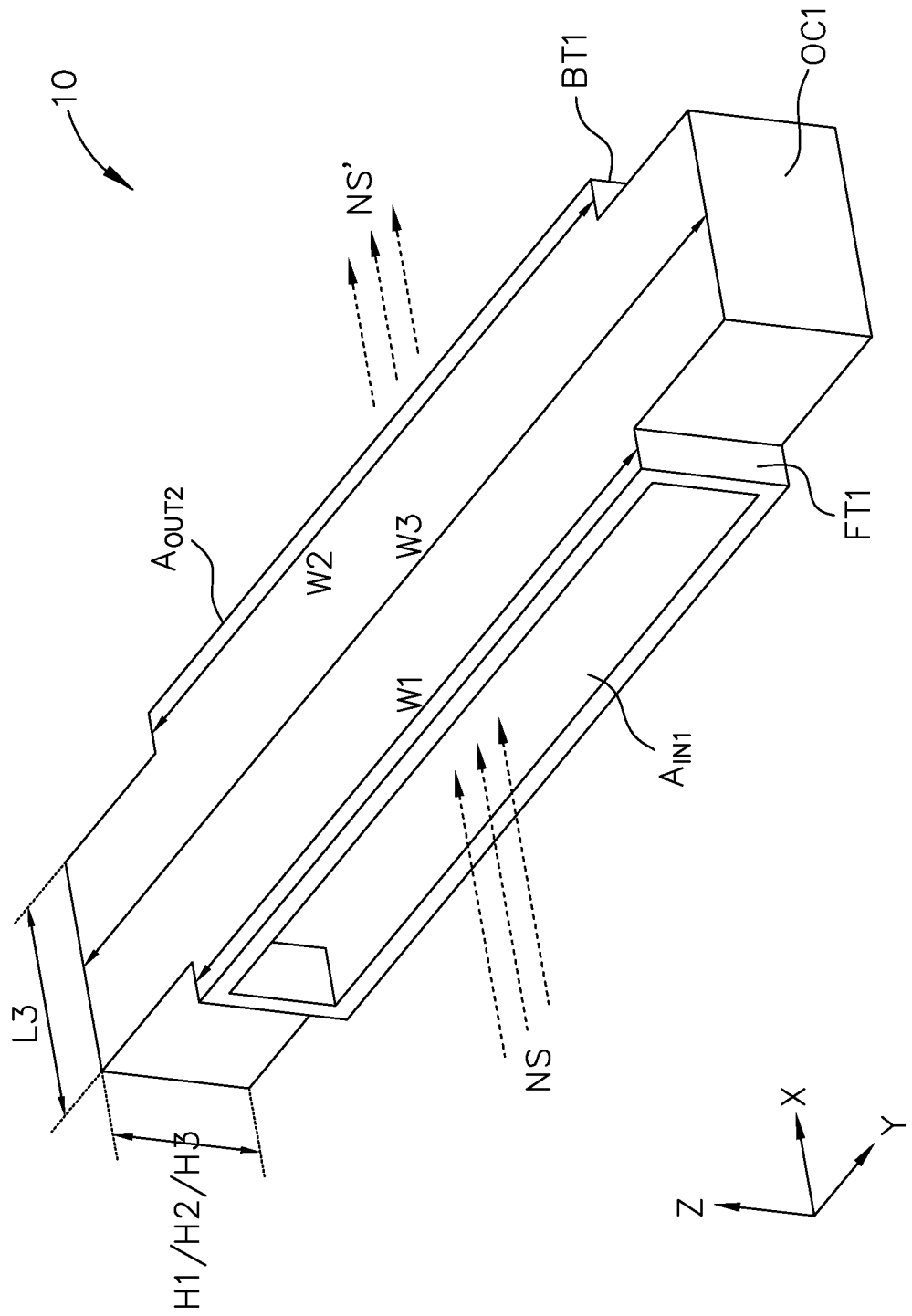
FIG. 1 is a schematic diagram of an acoustic filter that can provide noise reduction functionality according to an embodiment of the present invention.
Figure 2A:
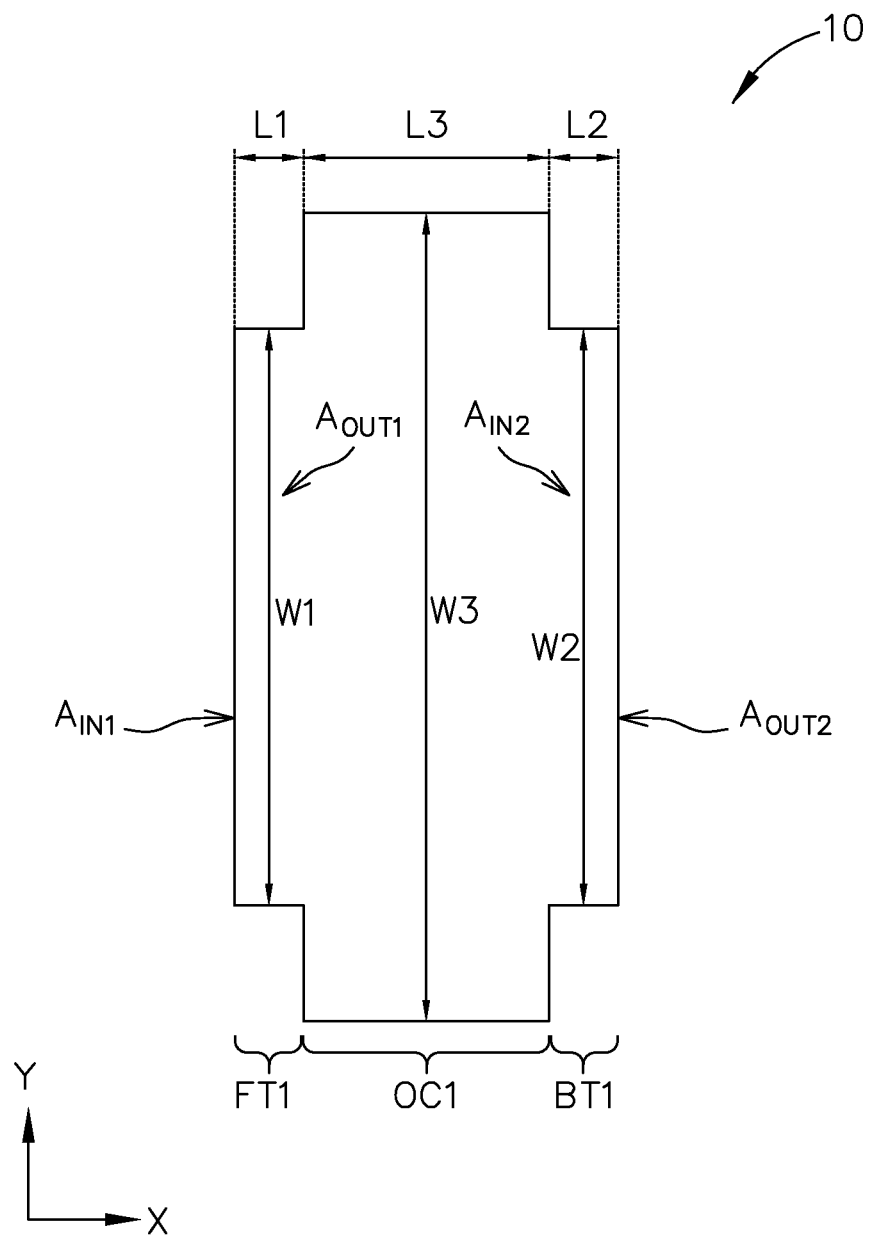
FIG. 2A is a top view (X-Y plane) of the acoustic filter according to an embodiment of the present invention.
Figure 2B:
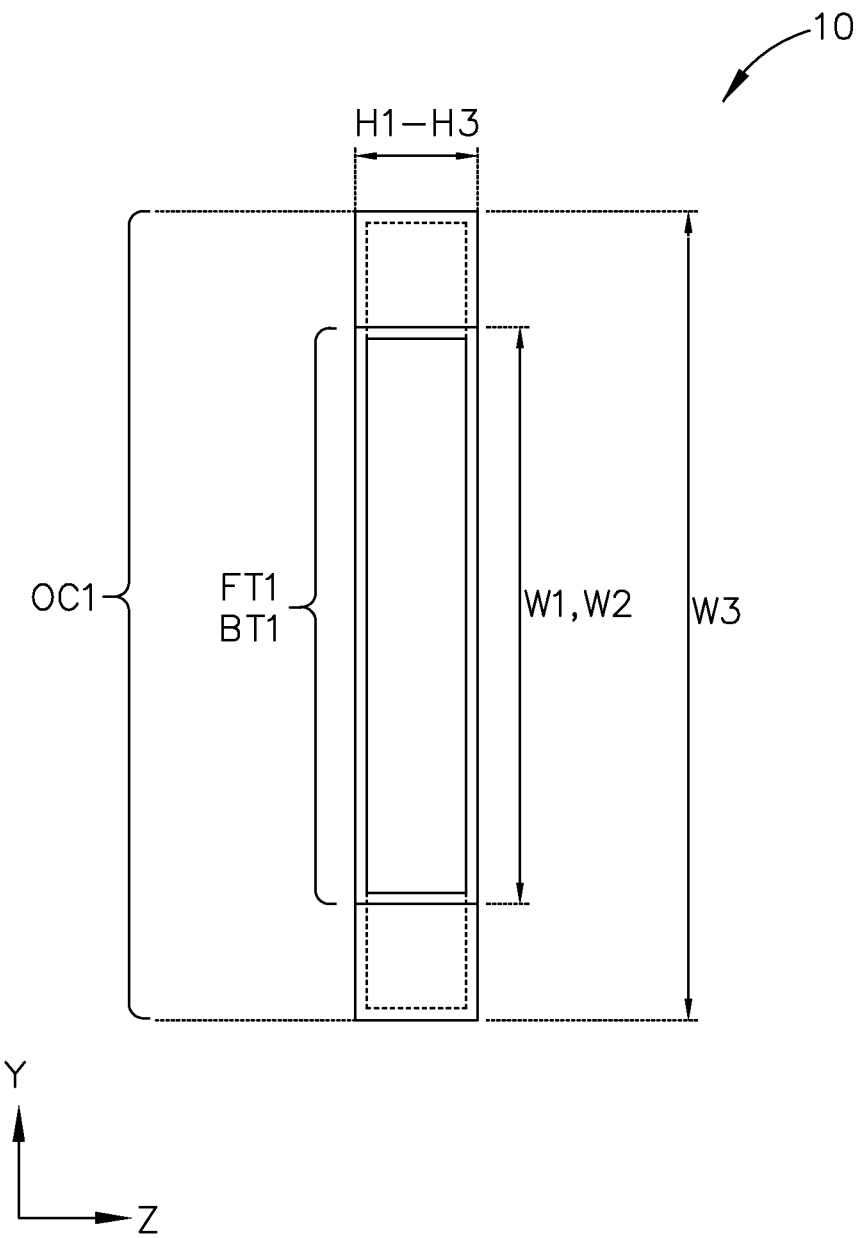
FIG. 2B is a side view (Y-Z plane) of the acoustic filter according to an embodiment of the present invention.
Figure 2C:
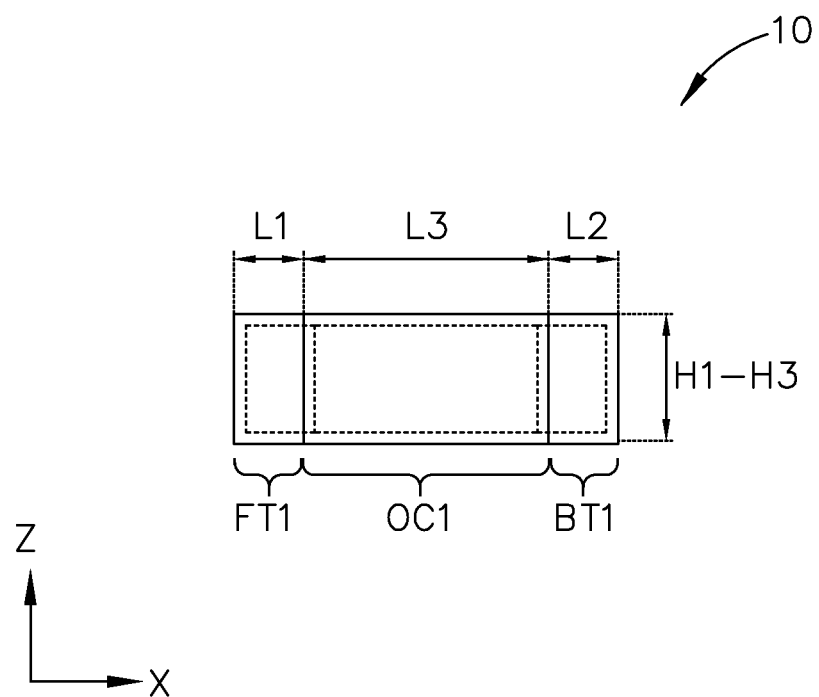
FIG. 2C is a side view (Z-X plane) of the acoustic filter according to an embodiment of the present invention.

FIG. 1 is a schematic diagram of an acoustic filter 10 that can provide noise reduction functionality according to an embodiment of the present invention. FIG. 2A is a top view (X-Y plane) of the acoustic filter 10 according to an embodiment of the present invention. FIG. 2B is a side view (Y-Z plane) of the acoustic filter 10 according to an embodiment of the present invention. FIG. 2C is a side view (Z-X plane) of the acoustic filter 10 according to an embodiment of the present invention.

As shown in FIG. 1 and FIG. 2A to FIG. 2C, the acoustic filter 10 includes a front duct FT1, a back duct BT1, and a single expansion chamber OC1. When describing the structure of the acoustic filter 10, the three sides representing the length, width, and height are parallel to the X-axis, the Y-axis, and the Z-axis, respectively, wherein the length, width, and height of the front duct FT1 are denoted by L1, W1, and H1 respectively. The length, width, and height of the back duct BT1 are denoted by L2, W2, and H2, respectively. The length, width, and height of the single expansion chamber OC1 are denoted by L3, W3, and H3, respectively.

$A_{IN1}$ represents the inlet of the front duct FT1 (the "first sound-inlet port"), and $A_{OUT1}$ represents the outlet (the "first sound outlet") of the front duct FT1, wherein the cross-sectional area of the first sound-inlet port Ami of the front duct FT1 of the acoustic filter 10 is defined by the width and height of the front duct FT1, and thus the cross-sectional area of the first sound-inlet port AIN1 is W1*H1.

$A_{IN2}$ represents the inlet of the back duct BT1 (the "second sound-inlet port"), and $A_{OUT2}$ represents the outlet of the back duct BT1 (the "second sound outlet"). The cross-sectional area of the second sound outlet $A_{OUT2}$ of the back duct BT1 of the acoustic filter 10 is defined by the width and height of the back duct BT1. That is, the cross-sectional area of the second sound outlet $A_{OUT2}$ of the back duct BT1 of the acoustic filter 10 is W2*H2.

In the embodiment shown in FIGS. 1 and FIG. 2A to FIG. 2C, the acoustic filter 10 has a symmetrical structure, wherein a central axis of the first sound-inlet port AIN1 of the front duct FT1 and a central axis of the first sound outlet AOUT1 of the back duct BT1 correspond to a central axis of a cavity of the single expansion chamber OC1.

Figure 3:
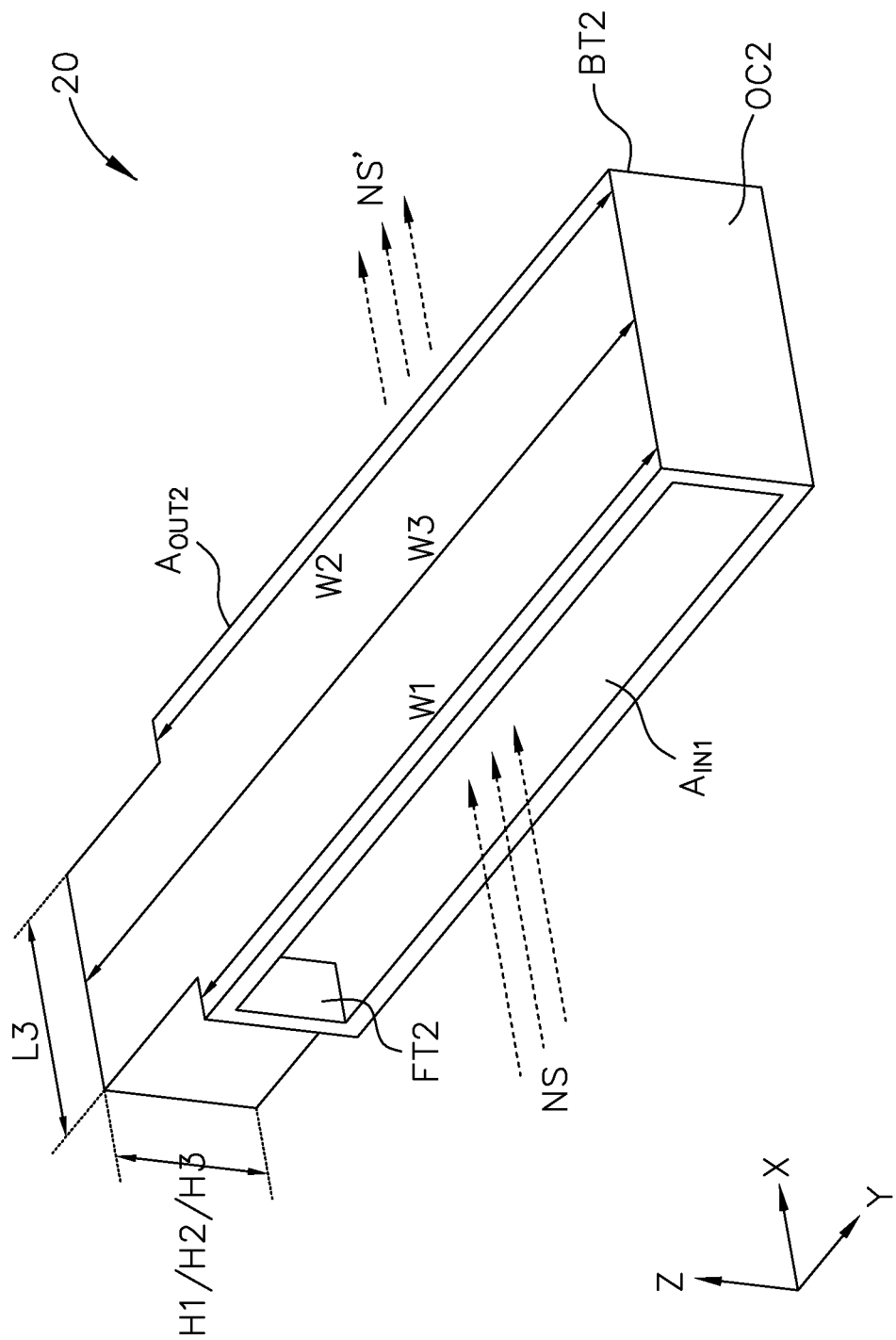
FIG. 3 is a schematic diagram of a second acoustic filter that can provide noise reduction functionality according to an embodiment of the present invention.
Figure 4A:
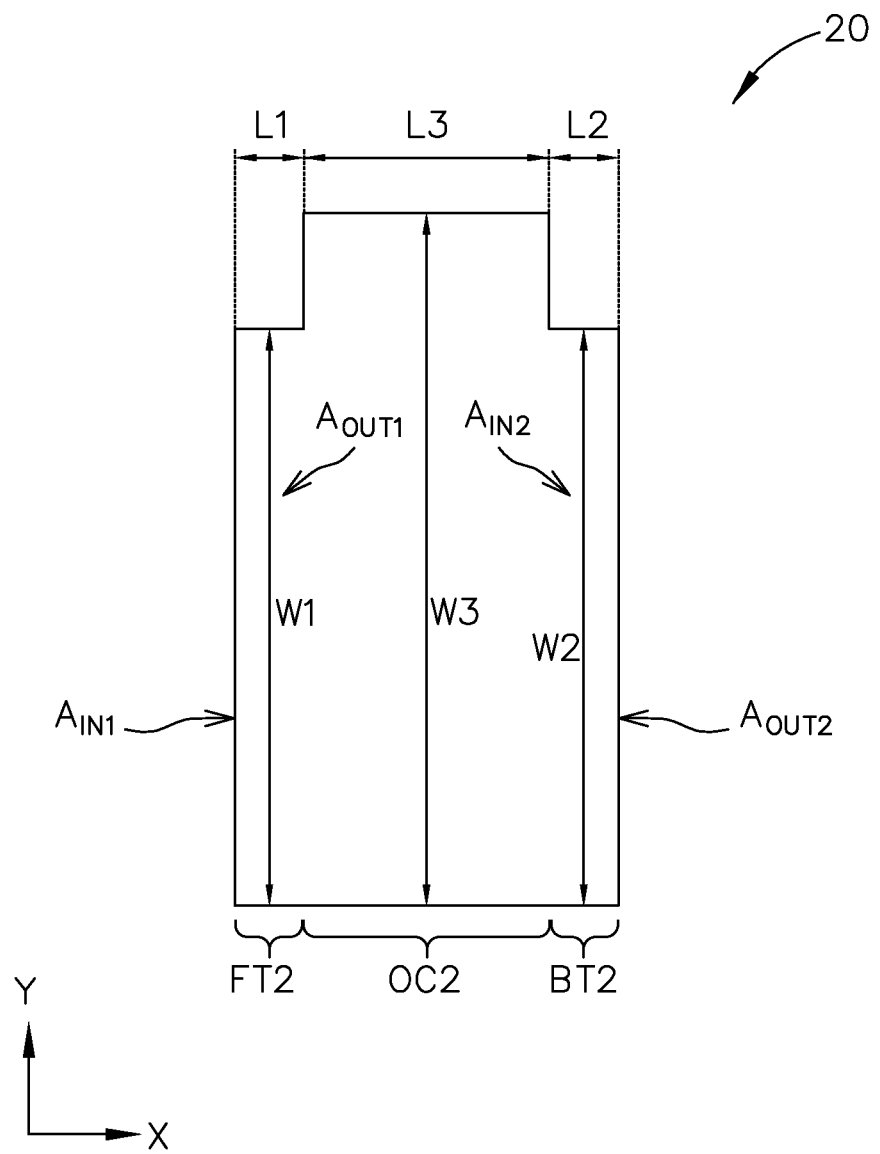
FIG. 4A is a top view (X-Y plane) of the second acoustic filter according to an embodiment of the present invention.
Figure 4B:
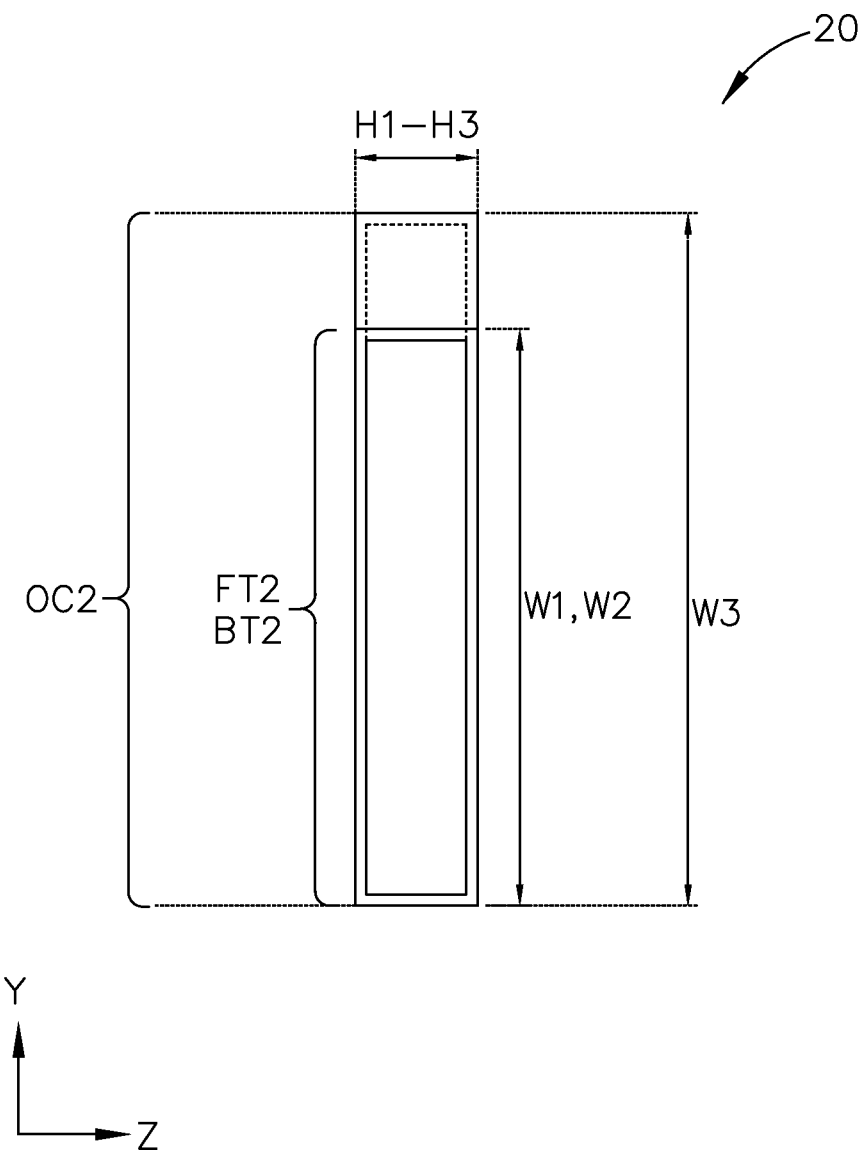
FIG. 4B is a side view (Y-Z plane) of the second acoustic filter according to an embodiment of the present invention.
Figure 4C:
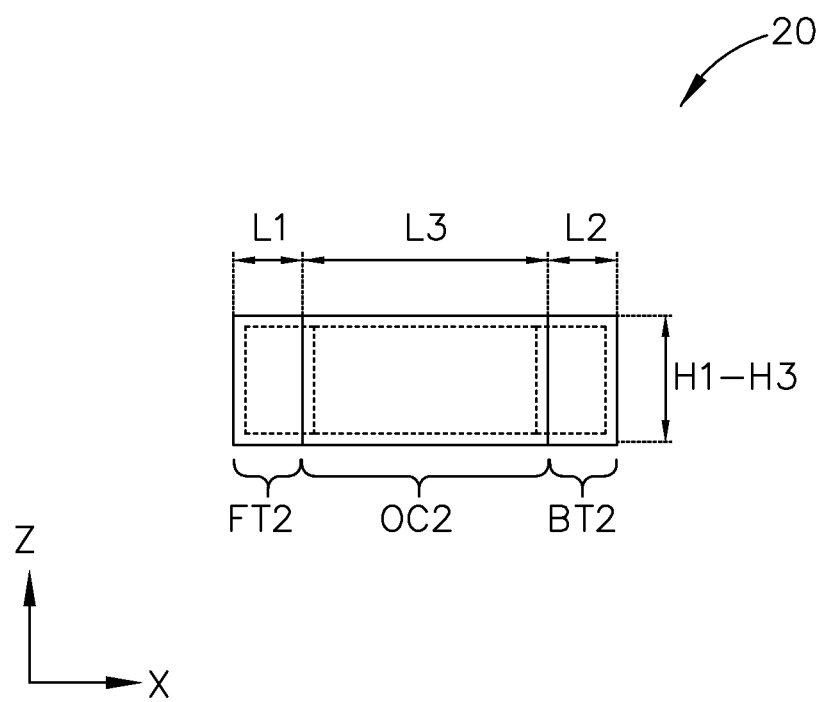
FIG. 4C is a side view (X-Z plane) of the second acoustic filter according to an embodiment of the present invention.

FIG. 3 is a schematic diagram of an acoustic filter 20 that can provide noise reduction functionality according to a second embodiment of the present invention. FIG. 4A is a top view (X-Y plane) of the acoustic filter 20 in the second embodiment of the present invention. FIG. 4B is a side view (Y-Z plane) of the acoustic filter 20 in the second embodiment of the present invention. FIG. 4C is a side view (X-Z plane) of the acoustic filter 20 in the second embodiment of the present invention.

As shown in FIGS. 3 and FIG. 4A to FIG. 4C, the acoustic filter 20 includes a front duct FT2, a back duct BT2, and a single expansion chamber OC2. When describing the structure of the acoustic filter 20, the three sides representing the length, width, and height are parallel to the X-axis, Y-axis, and Z-axis, respectively, wherein the length, width, and height of the front duct FT2 are denoted by L1, W1, and H1, respectively. The length, width, and height of the back duct BT2 are denoted by L2, W2, and H2, respectively. The length, width, and height of the single expansion chamber OC2 are denoted by L3, W3 and H3 respectively.

$A_{IN1}$ represents the inlet of the front duct FT2 (the "first sound-inlet port"), and $A_{OUT1}$ represents the outlet of the front duct FT2 (the "first sound outlet"), wherein the cross-sectional area of the first sound-inlet port $A_{IN1}$ of the front duct FT1 of the acoustic filter 20 is defined by the width and height of the front duct FT2, and thus the cross-sectional area is W1*H1.

$A_{IN2}$ represents the second inlet ("second sound-inlet port") of the back duct BT2, and $A_{OUT2}$ represents the second outlet (the "second sound outlet") of the back duct BT2, wherein the cross-sectional area of the second sound outlet $A_{OUT2}$ of the back duct BT1 of the acoustic filter 20 is defined by the width and height of the back duct BT2, and thus the cross-sectional area of the second sound outlet $A_{OUT2}$ of the back duct BT1 of the acoustic filter 20 is W2*H2.

In the embodiment shown in FIGS. 3 and FIG. 4A to FIG. 4C, the acoustic filter 20 has an asymmetric structure, wherein a central axis of the second sound-inlet port AIN2 of the front duct FT2 and a central axis of the second sound outlet AOUT2 of the back duct BT2 do not correspond to a central axis of the cavity of the single expansion chamber OC2.

Figure 5:
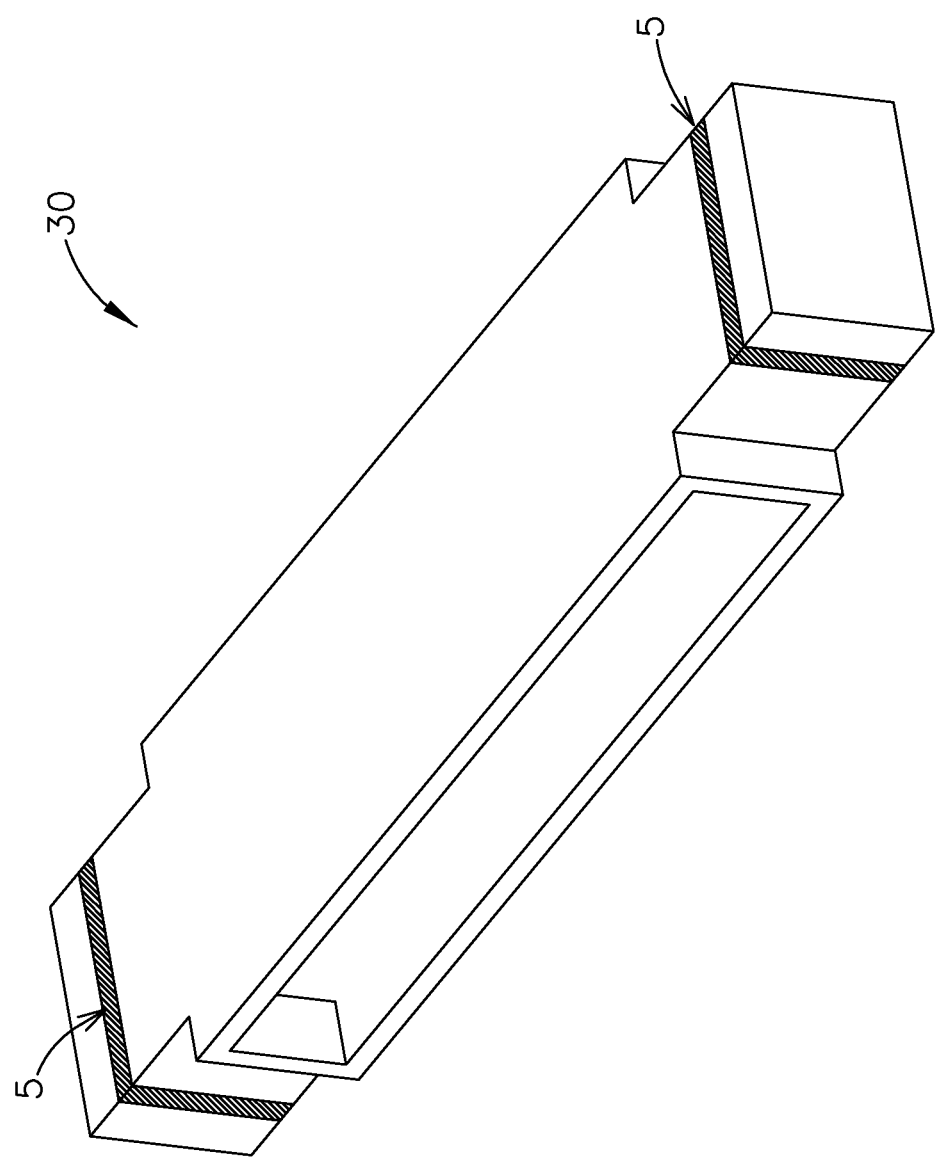
FIG. 5 is a schematic diagram of an acoustic filter that can provide noise reduction functionality according to another embodiment of the present invention.
Figure 6:
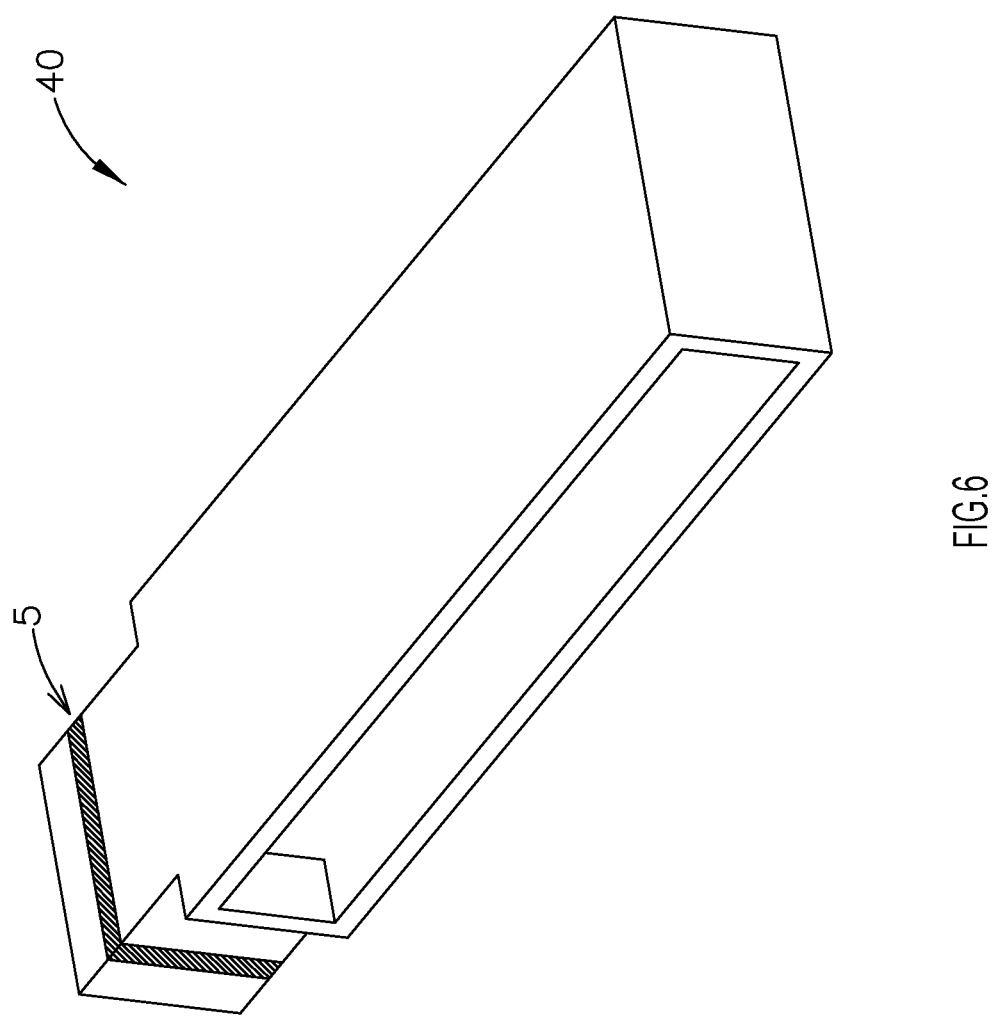
FIG. 6 is a schematic diagram of an acoustic filter that can provide noise reduction functionality according to yet another embodiment of the present invention.

FIG. 5 is a schematic diagram of an acoustic filter 30 that can provide noise reduction functionality in another embodiment of the present invention. FIG. 6 is a schematic diagram of an acoustic filter 40 that can provide noise reduction functionality according to still another embodiment of the present invention. The structure of the acoustic filter 30 is the same as that of the acoustic filter 10, and the structure of the acoustic filter 40 is the same as that of the acoustic filter 20, and, as such, the descriptions thereof are not repeated here, and the indications of the relevant dimensions are omitted in FIGS. 5 and 6. However, unlike acoustic filters 10 and 20, acoustic filters 30 and 40 additionally comprise sound absorbing material 5. For example, sound absorbing material can be disposed as part of the wall structure of expansion chambers OC1 and OC2. In different embodiments, the sound-absorbing material 5 may include various types of rubber, foam, glass fiber, rock wool, and the like. Such material may be incorporated into the wall of the expansion chambers OC1 and OC2 using adhesive, for example. Those skilled in the art will appreciate that the type, and installation position and method of the sound absorbing material 5 is not intended to limit the scope of the present invention.

Figure 7:
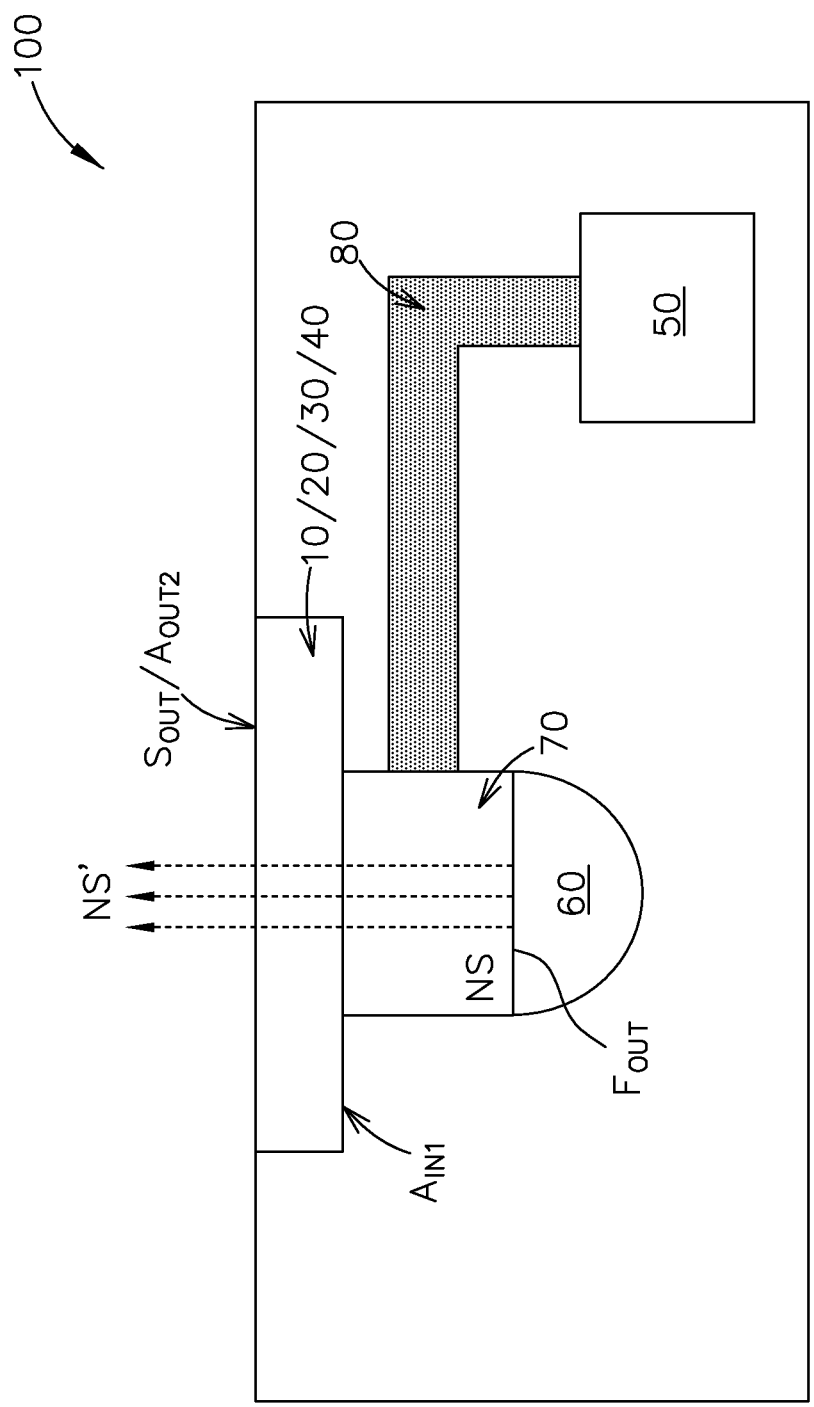
FIG. 7 is a schematic diagram of an electronic system with heat dissipation and noise reduction functionality according to an embodiment of the present invention.

FIG. 7 is a schematic diagram of an electronic system 100 with heat dissipation and noise reduction capabilities according to an embodiment of the present invention. The electronic system 100 includes an acoustic filter 10, 20, 30, or 40, a processor 50, a fan 60, a heat sink 70, and a heat pipe 80. The processor 50 is configured to control the operation of various components in the electronic system 100. The processor 50 is the main source of heat in the electronic system 100. The heat sink 70 and the heat pipe 80 are configured to conduct heat energy generated by the processor 50 toward the fan air outlet $F_{OUT}$ of the fan 60, and then air pushed by the fan 60 discharges the heat energy through the system air outlet $S_{OUT}$ of the electronic system 100. One of the acoustic filters 10, 20, 30, or 40 is disposed between the system air outlet $S_{OUT}$ of the electronic system 100 and the heat sink 70 to reduce the noise NS generated by the fan 60 when it operates. The center of the cavity of the single expansion chamber OC1/OC2 of the acoustic filter 10/20/30/40 is arranged to correspond to the center axis of the fan 60.

As the noise NS generated while the fan 60 is operating passes through the heat sink 70, the acoustic filter 10, 20, 30, or 40 operates to dampen the noise NS so that the noise NS that reaches the system air outlet $S_{OUT}$ of the electronic system 100 becomes attenuated noise NS'. The sound pressure level (dB SPL) of the attenuated noise NS' is lower than the sound pressure level of the noise NS. In the present invention, the first sound-inlet port AIN1 of the front duct FT1/FT2 in the acoustic filter 10, 20, 30, or 40 is airtightly connected to the heat sink 70, and the back duct BT1/BT2 of the acoustic filter 10, 20, 30, or 40 is airtightly connected to the system air outlet $S_{OUT}$ of the electronic system 100, so that the noise NS of the fan 60 is dampened or attenuated. In addition, the first sound-inlet port $A_{IN1}$ of the front ducts FT1/FT2 and the second sound outlet $A_{OUT2}$ of the back ducts BT1/BT2 in the acoustic filters 10, 20, 30, and 40 may have the same cross-sectional area as the fan outlet $F_{OUT}$ of the fan 60. As such, the heat dissipation effect of the fan 60 is not detrimentally affected.

Figure 8A:
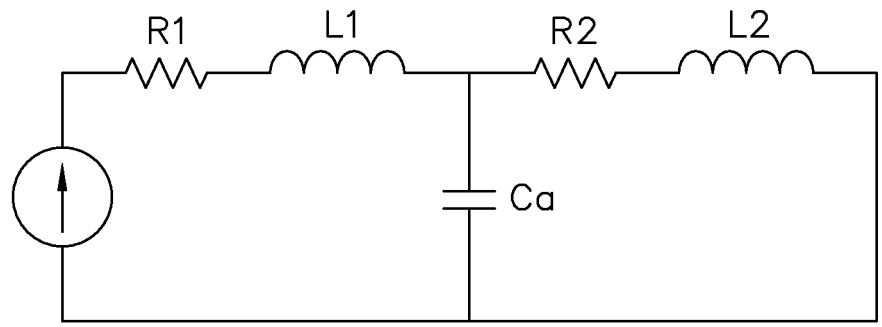
FIGS. 8A-8C are equivalent electronic circuit diagrams of the acoustic filters consistent with the several embodiments of the present invention.
Figure 8B:
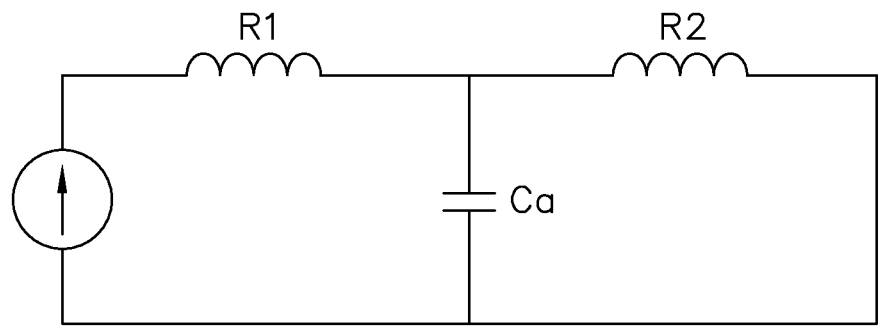
Figure 8C:
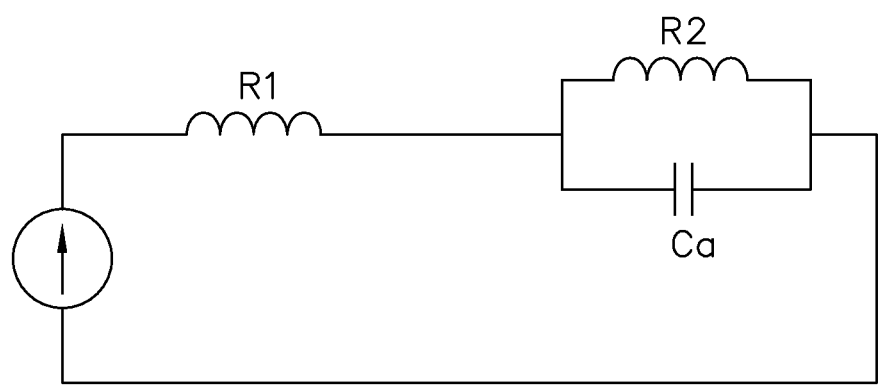

FIGS. 8A-8C are equivalent circuit diagrams of the acoustic filter 10/20/30/40 operating in the embodiment of the present invention. Because the cross-sectional area (W3*H3) of the single expansion chambers OC1 and OC2 in the acoustic filter 10/20/30/40 of the present invention is different from the cross-sectional area of the fan outlet FOUT of the fan 60 (that is, the cross-sectional area of the first sound-inlet port AIN1 of the front duct FT1/FT2 is W1*H1), when the noise of the fan 60 reaches the system air outlet $S_{OUT}$ of the electronic device 100 through the front duct FT1/FT2, the single expansion chamber OC1/OC2 and the back duct BT1/BT2, in sequence, the acoustic filter 10, 20, 30 or 40 will generate reflected sound waves below a certain cutoff frequency to cancel the peaks of sound waves at certain frequencies to achieve the effect of reducing sound pressure.

In this regard, and as shown in FIG. 8A, the operation of the acoustic filter 10/20/30/40 of the present invention is similar to a low-pass filter and an acoustic oscillator, where the resistance R1 and the inductance L1 represent the contribution of the front duct FT1/FT2, and the capacitance Ca represents the contribution of the single expansion chamber OC1/OC2, while resistor R2 and inductor L2 represent the contribution of the back duct BT1/BT2.

As shown in FIG. 8B, when the length L1 of the front duct FT1/FT2 and the length L2 of the back duct BT1/BT2 are much smaller than the length L3 of the single expansion chamber OC1/OC2, the contributions of the resistors R1 and R2 are negligible. As shown in FIG. 8C, the cut-off frequency of the acoustic filter 10/20/30/40 is related to the capacitance Ca, and the value of the capacitance Ca is determined by the structure of the single expansion chamber OC1/OC2, and the volume of the single expansion chamber OC1/OC2. The larger the volume value, the larger the value of the capacitance Ca, and the larger the cutoff frequency of the reflected sound waves generated by the acoustic filters 10/20/30/40.

In one embodiment, the present invention can increase the cut-off frequency of the reflected sound waves generated by the acoustic filters 10/20/30/40 by increasing the length L3 of the single expansion chamber OC1/OC2, thereby filtering out noise with higher frequencies. In one embodiment, the present invention can increase the cut-off frequency of the reflected sound waves generated by the acoustic filter 10/20/30/40 by increasing the width W3 of the single expansion chamber OC1/OC2, thereby obtaining greater attenuation at the filter frequency. And, as noted above, in the embodiments shown in FIGS. 5 and 6, the acoustic filters 30 and 40 may further include sound absorbing material 5 to enhance the noise reduction effect.

In one embodiment of implementing the acoustic filters 10 and 30, the length L1 of the front duct FT1 may be less than 5 mm, the width W1 may be 70 mm, and the height H1 may be 7 mm; the length L2 of the back duct BT1 may be less than 5 mm, the width W2 may be 70 mm, and the height H2 may be 7 mm; the length L3 of the single expansion chamber OC1 may be between 10 mm and 15 mm, the width W3 may be 130 mm or not less than 2*W1, and the height H3 may be 7 mm. The acoustic filters 10 and 30 of the above size can filter out fan noise below 2 KHz. The dimensions provided herein are not meant to limit the scope of the present invention.

In one embodiment of implementing the acoustic filters 20 and 40, the length L1 of the front duct FT1 may be less than 5 mm, the width W1 may be 70 mm, and the height H1 may be 7 mm; the length L2 of the back duct BT1 may be less than 5 mm, the width W2 may be 70 mm, and the height H2 may be 7 mm; the length L3 of the single expansion chamber OC2 may be between 10 mm and 15 mm, the width W3 may be 100 mm or not less than W1, and the height H3 may be 7 mm. The acoustic filters 20 and 40 of the above size can filter out fan noise below 2 KHz. The dimensions provided herein not meant to limit the scope of the present invention.

In the present invention, the height H1 of the front duct FT1/FT2, the height H2 of the back duct BT1/BT2 and the height H2 of the single expansion chamber OC1/OC2 in the acoustic filter 10/20/30/40 are the same as the height of the fan outlet FOUT of the fan 60. As a result, the heat dissipation performance of the fan 60 is not detrimentally affected.

In one embodiment, the electronic system 100 may be a notebook computer, or other electronic device with limited body space.

In sum, in the electronic system of the present invention, a fan can provide heat dissipation functionality, and the acoustic filter described herein can reduce the noise generated when the fan operates. The acoustic filter of the present invention generates reflected sound waves with a specific cut-off frequency as a result of the change of the cross-sectional area on the sound wave path, and then cancels the sound wave peaks of certain frequencies in the noise. Thus, the present invention provides both heat dissipation and improved noise reduction capabilities.

The above description is intended by way of example only.

What is claimed is:

1. An electronic system, comprising
a system air outlet;
a heat sink;
a fan disposed on a first side of the heat sink; and
an acoustic filter disposed between the system air outlet and a second side of the heat sink, the acoustic filter including a front duct, a back duct, and an expansion chamber disposed between the front duct and the back duct, wherein the expansion chamber comprises at least one portion that extends widthwise beyond a side of each of the front duct and the back duct, and wherein a ratio of a width of the at least one portion and a width of each of the front duct and the back duct is about 3:7.

2. The electronic system of claim 1, wherein the front duct is airtightly connected to the heat sink.

3. The electronic system of claim 2, wherein the back duct has the same dimensions as the front duct.

4. The electronic system of claim 3, wherein the back duct is airtightly connected to the system air outlet.

5. The electronic system of claim 3, wherein a central axis of the front duct and a central axis of the back duct correspond to a central axis of a cavity of the expansion chamber.

6. The electronic system of claim 3, wherein the expansion chamber extends an equal distance, along its width, beyond opposite sides of the front duct.

7. The electronic system of claim 3, wherein a central axis of the front duct and a central axis of the back duct do not correspond to a central axis of a cavity of the expansion chamber.

8. The electronic system of claim 3, wherein the expansion chamber extends an unequal distance along its width beyond opposite sides of the front duct.

9. The electronic system of claim 1, wherein the expansion chamber comprises a sound absorbing material disposed in a least a portion of a wall of the expansion chamber.

10. The electronic system of claim 9, wherein the sound absorbing material comprises at least one of rubber, foam, glass fiber and rock wool.

11. The electronic system of claim 1, wherein the acoustic filter dampens noise generated by the fan at frequencies below 2 KHz.

12. An electronic system, comprising:
a system air outlet;
a heat sink;
a fan disposed adjacent a first side of the heat sink; and
an acoustic filter disposed between the system air outlet and a second side of the heat sink, wherein the acoustic filter comprises a front duct, a back duct, and an expansion chamber disposed between the front duct and the back duct, wherein the expansion chamber has a width that is greater than a width of the front duct and the back duct and comprises at least one portion that extends beyond a side position of each of the front duct and the back duct, and wherein a ratio of a width of the at least one portion and a width of each of the front duct and the back duct is about 3:7.

13. The electronic system of claim 12, wherein a central axis of the front duct and a central axis of the back duct correspond to a central axis of a cavity of the expansion chamber.

14. The electronic system of claim 12, wherein the expansion chamber extends an equal distance, along its width, beyond opposite sides of the front duct.

15. The electronic system of claim 12, wherein a central axis of the front duct and a central axis of the back duct do not correspond to a central axis of a cavity of the expansion chamber.

16. The electronic system of claim 12, wherein the expansion chamber extends an unequal distance along its width beyond opposite sides of the front duct.

17. The electronic system of claim 12, wherein the expansion chamber comprises a sound absorbing material disposed in a least a portion of a wall of the expansion chamber.

18. The electronic system of claim 17, wherein the sound absorbing material comprises at least one of rubber, foam, glass fiber and rock wool.

19. The electronic system of claim 12, wherein the acoustic filter dampens noise generated by the fan at frequencies below 2 KHz.

\* \* \* \* \*